United States Patent
Lin et al.

(10) Patent No.: US 8,232,114 B2
(45) Date of Patent: Jul. 31, 2012

(54) RTP SPIKE ANNEALING FOR SEMICONDUCTOR SUBSTRATE DOPANT ACTIVATION

(75) Inventors: Chin-Ming Lin, Jhunan Township (TW); Chung-Ru Yang, Chung-Ho (TW); Chi-Ming Yang, Hsian-San District (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 547 days.

(21) Appl. No.: 12/360,437

(22) Filed: Jan. 27, 2009

(65) Prior Publication Data
US 2010/0190274 A1 Jul. 29, 2010

(51) Int. Cl.
*H01L 21/324* (2006.01)
*C30B 1/02* (2006.01)

(52) U.S. Cl. .......... 438/16; 438/31; 438/663; 117/7

(58) Field of Classification Search .................. None
See application file for complete search history.

(56) References Cited

U.S. PATENT DOCUMENTS

| | | | |
|---|---|---|---|
| 5,296,385 A | 3/1994 | Moslehi et al. | |
| 5,618,461 A | 4/1997 | Burke et al. | |
| 5,783,804 A | 7/1998 | Burke et al. | |
| 5,861,609 A | 1/1999 | Kaltenbrunner et al. | |
| 6,122,440 A | 9/2000 | Campbell | |
| 6,165,884 A | 12/2000 | Lee et al. | |
| 6,362,081 B1 | 3/2002 | Chuang | |
| 6,410,343 B1 | 6/2002 | Li et al. | |
| 6,475,815 B1 * | 11/2002 | Nambu et al. | 438/16 |
| 6,483,137 B2 | 11/2002 | Li et al. | |
| 6,616,857 B2 | 9/2003 | Li et al. | |
| 6,759,632 B2 | 7/2004 | Ducret et al. | |
| 6,911,376 B2 | 6/2005 | Yoo | |
| 7,305,651 B2 | 12/2007 | Cao | |
| 2002/0018904 A1 | 2/2002 | Li et al. | |
| 2002/0022278 A1 | 2/2002 | Li et al. | |
| 2004/0023472 A1 | 2/2004 | Niwayama et al. | |
| 2004/0043612 A1 | 3/2004 | Jung | |
| 2004/0052511 A1 | 3/2004 | Ducret et al. | |
| 2007/0134568 A1 * | 6/2007 | Ushida et al. | 430/5 |
| 2008/0169468 A1 | 7/2008 | Ahn | |
| 2008/0267237 A1 * | 10/2008 | Hall et al. | 372/45.01 |
| 2009/0120924 A1 * | 5/2009 | Moffatt et al. | 219/385 |

OTHER PUBLICATIONS

Erik Bründermann et al., First operation of a far-infrared p-germanium laser in a standard close-cycle machine at 15 K' Jun. 1997, Infrared Physics & Technology, vol. 38, Issue 4, pp. 201-203.*

(Continued)

*Primary Examiner* — Zandra Smith
*Assistant Examiner* — Pamela E Perkins
(74) *Attorney, Agent, or Firm* — Duane Morris LLP (57) ABSTRACT

A semiconductor substrate has a plurality of active device patterns. At least some of the active device patterns comprise doped regions. The substrate has a plurality of surface regions, including the active device patterns and un-patterned regions, with respectively different reflectances for light in a near infrared wavelength. A first difference is determined, between a largest reflectance at the near infrared wavelength and a smallest reflectance at the near infrared wavelength. A second infrared wavelength is determined, for which a second difference between a largest reflectances a smallest reflectance is substantially less than the first difference at the near infrared wavelength. A rapid thermal processing (RTP) spike annealing dopant activation step is performed on the substrate using a second light source providing light at the second wavelength.

21 Claims, 7 Drawing Sheets

OTHER PUBLICATIONS

Woo Sik Yoo and Kitaek Kang of WaferMasters Inc., San Jose, CA. Rapid Thermal Scanning for Dopant Activation for Advanced Junction Technology. This paper appears in: Junction Technology, 2007 International Workshop, Publication Date: Jun. 8-9, 2007, on pp. 119-120. ISBN: 1-4244-1103-3. USA.

J. Harnish and C. Carlson of Micron Technology, Inc., and J. Foggiato, K. Kang and W.S.Yoo of WaferMasters, Inc. Electrical Activation and Dopant Diffusion of Heavily Boron Implanted Silicon. This paper appears at: www.wafermasters.com/Publications/ECS2005_K1_1513O%20 Harnish.pdf. USA.

Corresponding Chinese Application No. 200910162398.8 Office Action Jul. 13, 2011, pp. 1-3.

* cited by examiner

RTP SPIKE ANNEALING FOR SEMICONDUCTOR SUBSTRATE DOPANT ACTIVATION

FIELD OF THE INVENTION

The present invention relates to semiconductor fabrication methods.

BACKGROUND

Extrinsic semiconductors rely on dopants to provide a desired density of charge carriers. Two major steps are involved: dopant implantation and dopant activation. In conventional CMOS manufacturing, an ion beam implants dopants into the wafer, but they are not yet in position to provide the desired charge carrier density. Dopants can only contribute carriers when they are activated, or placed at silicon sites in the crystal lattice. After implantation, a high temperature anneal step has traditionally been used to activate the dopant ions and correct the lattice damage caused by the implant. If a soak anneal process is used, activation temperatures may exceed 1000° C.

Rapid Thermal Processing (RTP) spike annealing has been used as an alternative to bulk silicon thermal soak annealing for dopant activation. RTP spike annealing offers rapid surface anneal (second level) at a high temperature (>1000° C.) to maximize electrical activation of dopants with less diffusion.

However, traditional RTP spike anneal with specified thermal radiation wavelength suffered from a pattern loading effect due to differences in thermal absorption for different materials. Wafers having a variety of surface materials with different reflectances do not heat evenly. Regions having a low reflectance heat up less than regions having a high reflectance, interfering with uniformity of the dopant activation in the doped areas.

Improved dopant activation methods are desired.

SUMMARY OF THE INVENTION

In some embodiments, a method comprises providing a semiconductor substrate having a plurality of patterns formed thereon or therein. At least some of the patterns comprise doped regions. The substrate has a plurality of surface regions, including the patterns and un-patterned regions, with respectively different reflectances for light in a near infrared wavelength. A rapid thermal processing (RTP) spike annealing dopant activation step is performed on the substrate using far infrared light.

In some embodiments, a method comprises providing a semiconductor substrate having a plurality of active device patterns formed thereon or therein. At least some of the active device patterns comprise doped regions. The substrate has a plurality of surface regions, including the active device patterns and un-patterned regions, with respectively different reflectances for light in a near infrared wavelength. A first difference is determined, between a largest one of the different reflectances at the near infrared wavelength and a smallest one of the different reflectances at the near infrared wavelength. A second infrared wavelength is determined, for which a second difference between a largest one of the different reflectances for light at the second infrared wavelength and a smallest one of the different reflectances for light at the second infrared wavelength is substantially less than the first difference at the near infrared wavelength. A rapid thermal processing (RTP) spike annealing dopant activation step is performed on the substrate using a second light source providing light at the second wavelength.

In some embodiments, apparatus for processing a wafer comprises a chamber having a chuck therein for holding a semiconductor substrate having a plurality of patterns formed thereon or therein. At least some of the patterns comprise doped regions. The substrate has a plurality of surface regions, including the patterns and un-patterned regions, with respectively different reflectances for light in a near infrared wavelength. A light source is configured to direct a far infrared light onto the substrate. A controller controls the heating to perform a rapid thermal processing (RTP) spike annealing dopant activation step on the substrate.

DETAILED DESCRIPTION

This description of the exemplary embodiments is intended to be read in connection with the accompanying drawings, which are to be considered part of the entire written description.

Examples are described below in which an RTP spike anneal process is used for dopant activation. The local temperature fluctuation will influence dopant behavior.

Conventional RTP spike annealing for dopant activation has been performed using a light source wavelength from about 0.5 µm (visible-cyan) to about 0.9 µm (near infrared), for example, using a tungsten-halogen lamp.

Figure 1:
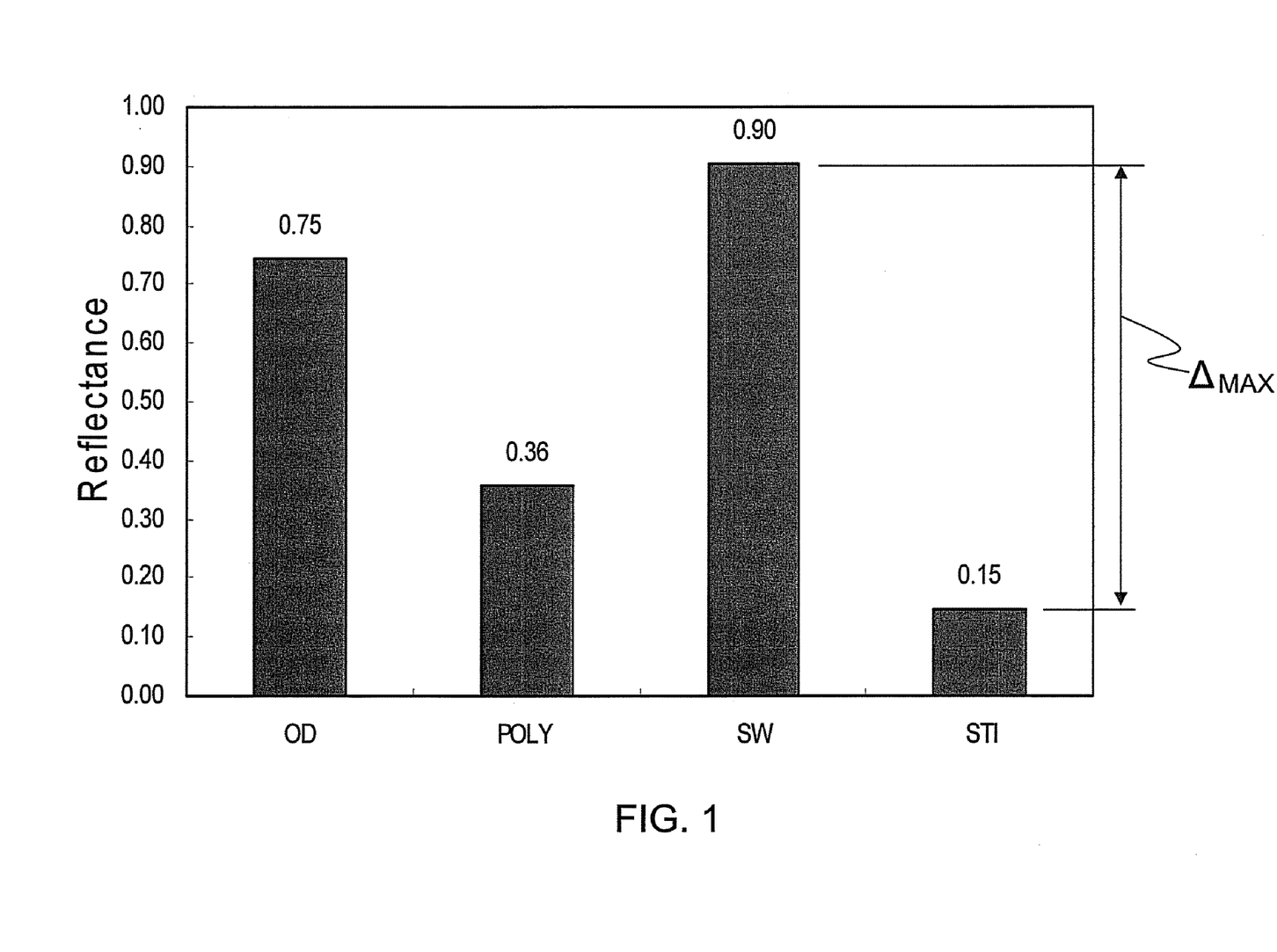
FIG. 1 is a diagram showing reflectance of various materials on a surface of a semiconductor wafer.

FIG. 1 is a histogram showing the surface reflectance of some typical semiconductor wafer surface materials, for visible (cyan) light having a wavelength of about 0.5 µm, including silicon (OD), polycrystalline silicon (Poly), nitride (SW), and shallow trench isolation (STI). The greatest difference among these materials is the difference $\Delta_{MAX}=0.75$ between the maximum reflectance of SW (0.9) and the minimum reflectance of STI region (0.15). For a given dose of light in this wavelength, the amount of heat per unit area reflected by SW is about 90% of that dose, and the amount reflected by the STI is about 15% of that dose. Assuming that substantially all of the light which is not reflected is absorbed (and not transmitted), either by the surface layer or the layer adjacent to the surface, the SW regions absorb about 10% of the dose, and the STI regions absorb about 85% of the dose. If the difference between the reflectances of two materials exposed to the same light intensity is high, the difference between the amount of heat absorbed by those materials is also high. The temperature increase of a material is proportional to the amount of heat supplied to the material. Therefore, the local temperature variation is correlated to the differences in reflectance of surrounding pattern designs during the thermal RTP process.

Non-uniform heating due to pattern loading may result in non-uniform dopant activation, both within die and between dies. The between-die effects may be even more likely to occur in multi-project wafers (MPW), such as the "CYBER-SHUTTLE"™ device prototyping service by Taiwan Semiconductor Manufacturing Co., Ltd., which include dies of multiple types on a single wafer. The different dies, having different pattern densities from each other, are likely to absorb heat differently from each other.

Absorption of radiation energy depends on material physical properties of reflectance and absorptance. The inventors have determined that, for materials commonly used in semiconductor integrated circuits, light having longer wavelengths shows less reflectance difference and less emissivity (absorption) difference than short wavelengths on variable materials having properties like those typically used in integrated circuit manufacturing. The inventors have determined that performing RTP spike annealing with longer radiation wavelengths can improve the pattern loading effect.

Figure 2:
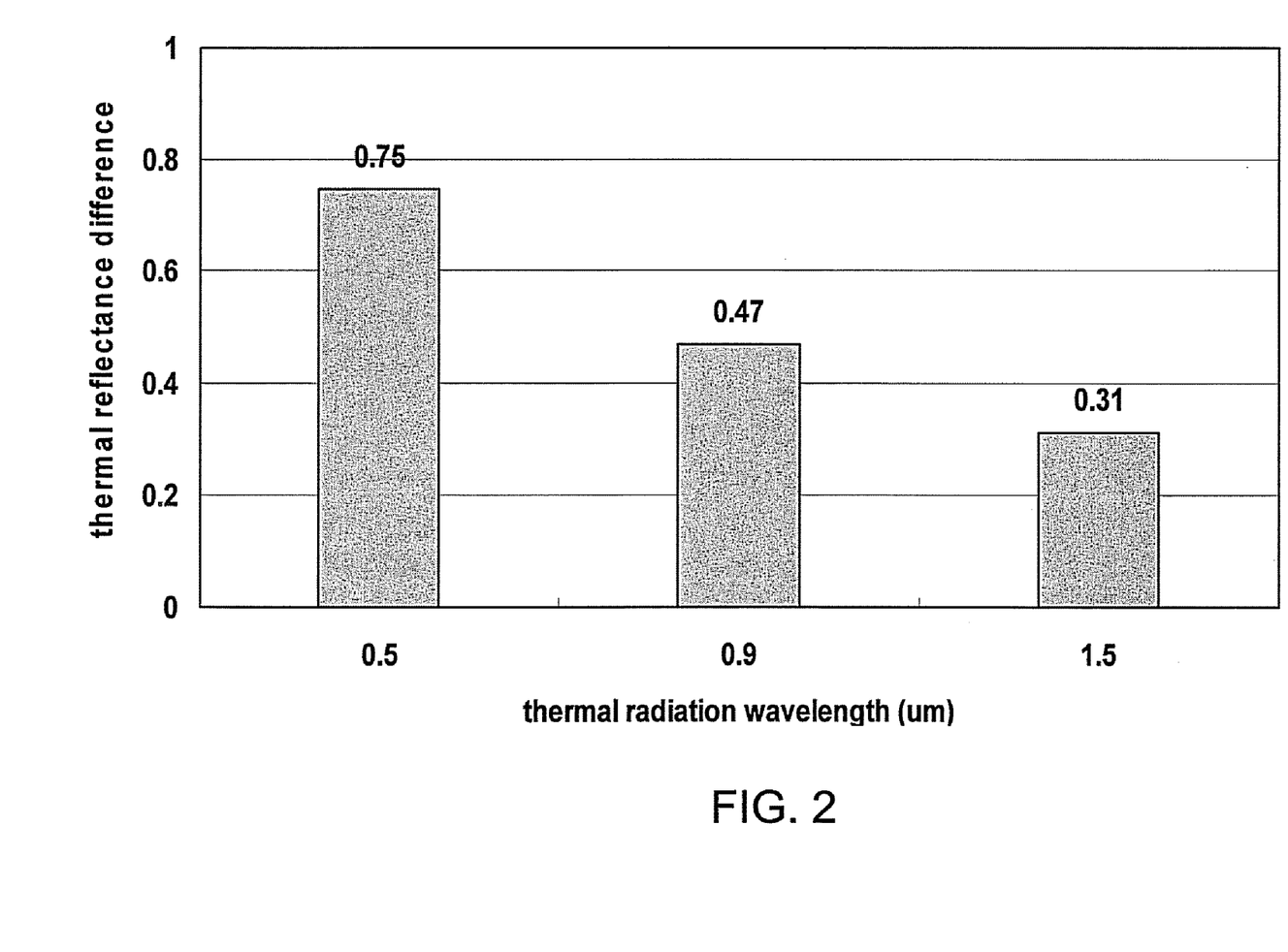
FIG. 2 is a diagram showing the maximum difference between material reflectances at various wavelengths.

FIG. 2 is a histogram showing the maximum reflectance difference among the various surface materials for a wafer having the same surface materials (oxide, Poly, SW and STI) as discussed above with reference to FIG. 1. These materials exhibit different reflectances for light at different wavelengths. For cyan (visible) light having a wavelength of about 0.5 μm, the maximum reflectance difference is 0.75, as discussed above with reference to FIG. 1. For near infrared light having a wavelength of 0.9 μm, the maximum reflectance difference between any two of the four materials (oxide, Poly, SW and STI) is 0.47. For short wavelength infrared light having a wavelength of 1.5 μm, the maximum reflectance difference between any two of the four materials (oxide, Poly, SW and STI) is 0.31.

Thus, the inventors have determined that for typical integrated circuit materials, the maximum difference in reflectance becomes smaller as the wavelength of the light is increased. Thus, various light sources may be used for RTP spike annealing which produce a substantially smaller value of the maximum reflectance difference $\Delta_{MAX}$ than results from the use of a near infrared light having a wavelength of about 0.9 μm.

In some embodiments, a light source having a wavelength of 1.0 μmm or longer is used. In some embodiments, a light source having a wavelength of 1.5 μm or longer is used. In some embodiments, a mid-wavelength infrared light source (2.5 μm to 8 μm) is used.

In some embodiments, the light source is a far infrared light with a long thermal radiation wavelength. Far infrared light can minimize the difference in reflectance among the reflectances for various materials at the surface of the semiconductor substrate, and result in a substantially smaller reflectance difference than near infrared light.

Figure 3:
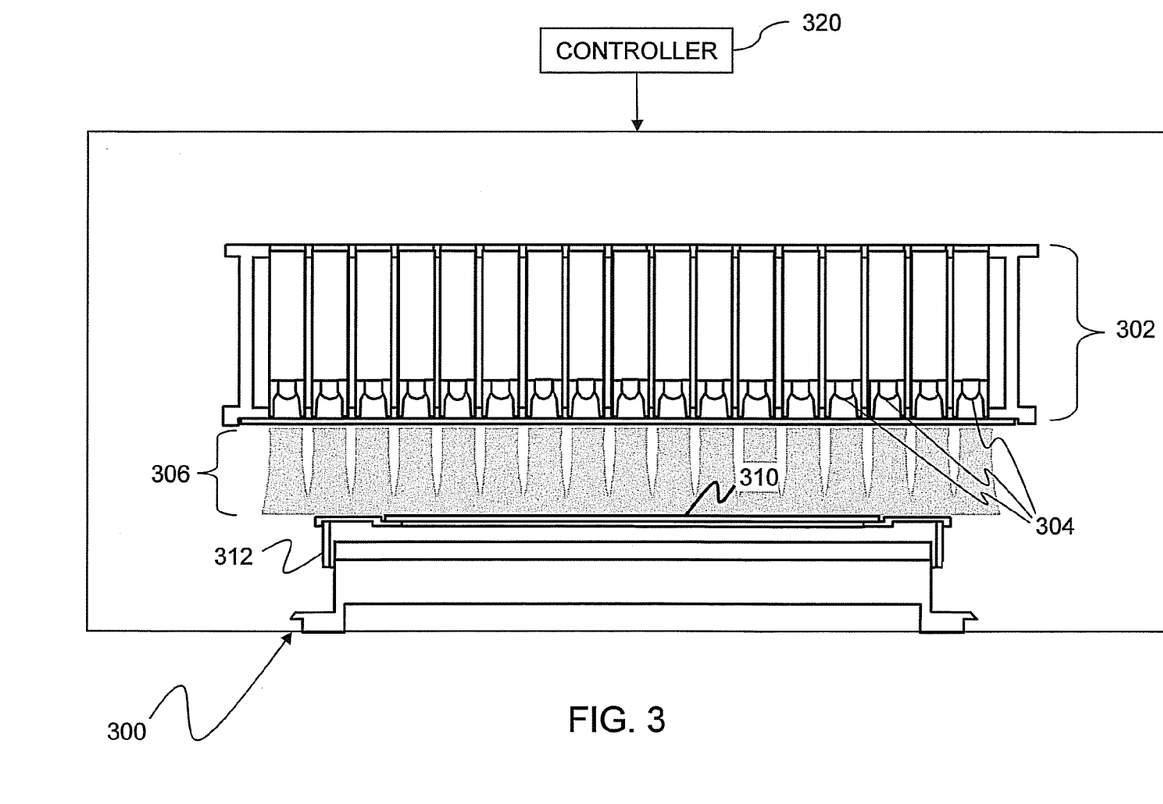
FIG. 3 is a schematic diagram of an exemplary apparatus.

FIG. 3 is a block diagram of an exemplary apparatus 300 for processing a wafer. The apparatus includes a chamber 300 having a chuck 312 therein for holding a semiconductor substrate 310. The substrate 310 has a plurality of patterns formed thereon or therein. At least some of the patterns comprise doped regions. The substrate 310 has a plurality of surface regions with respectively different reflectances for light in a near infrared wavelength.

A far-infrared laser 302 is configured to direct a far infrared light onto the substrate. In some embodiments, the far infrared laser 302 is one of the group consisting of a p-type germanium laser, a quantum cascade laser, a free electron laser, and a Femtosecond Ti:sapphire mode-locked laser. In some embodiments, the laser 302 is one of the group consisting of a Fabry-Perot laser, a distributed feedback laser, and an external cavity quantum cascade laser.

A controller 320 controls the laser 302 to perform a rapid thermal processing (RTP) spike annealing dopant activation step on the substrate. The controller 320 selects the time to initiate the RTP spike annealing step, and includes a timer to conclude the RTP spike annealing upon delivery of a suitable dose of light to perform the RTP spike annealing. For example, in one embodiment, RTP spike anneal is performed in 1 to 10 seconds within 1000-1200° C.

Figure 4:
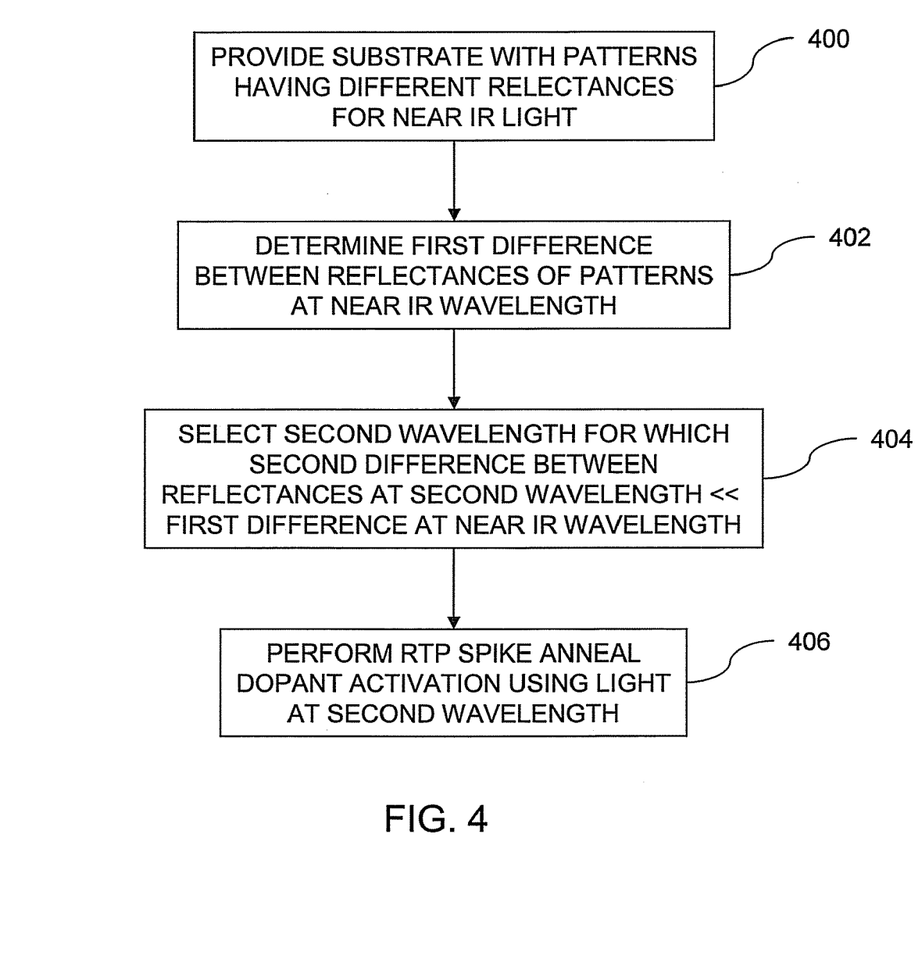
FIG. 4 is a flow chart of a method for performing dopant activation.

FIG. 4 is a flow chart of an exemplary method.

At step 400 a semiconductor substrate is provided, having a plurality of active device patterns formed thereon or therein. At least some of the active device patterns comprise doped regions. In some embodiments, the doped regions include at least one of the group consisting of boron, phosphorus, arsenic and $BF_2$. Other suitable dopants may be used.

The substrate has a plurality of surface regions with respectively different reflectances for light in a near infrared wavelength, such as oxide, bare silicon, polycrystalline silicon, nitride or STI. In some cases, a difference between a largest one of the reflectances and a smallest one of the reflectances at a near infrared wavelength (e.g., about 0.9 μm) is about 0.47.

At step 402, a first difference is determined, between a largest one of the different reflectances at the near infrared wavelength and a smallest one of the different reflectances at the near infrared wavelength.

At step 404, a second infrared wavelength is determined. At the second infrared wavelength, a second difference between a largest one of the different reflectances for light at the second infrared wavelength and a smallest one of the different reflectances for light at the second infrared wavelength is substantially less than the first difference at the near infrared wavelength. For example, if the second wavelength is selected to be 1.5 μm, then the second difference is the difference between a largest one of the reflectances for light at 1.5 μm and a smallest one of the reflectances for light at 1.5 μm. As shown in FIG. 2, at 1.5 μm, the second difference would be 0.31, and the second difference is less than the first difference (reflectance difference for near IR light at 0.9 μm) by about 0.16 or more.

At step 406, a rapid thermal processing (RTP) spike annealing dopant activation step is performed on the substrate 310 using a second light source 302 emitting light at the second wavelength.

In some embodiments, the rapid thermal processing (RTP) spike annealing dopant activation step 406 is performed using a far infrared laser 320.

In some cases, a difference between a largest one of the different reflectances and a smallest one of the different reflectances for light from the far infrared laser is about 0.31 or even less.

Figure 5:
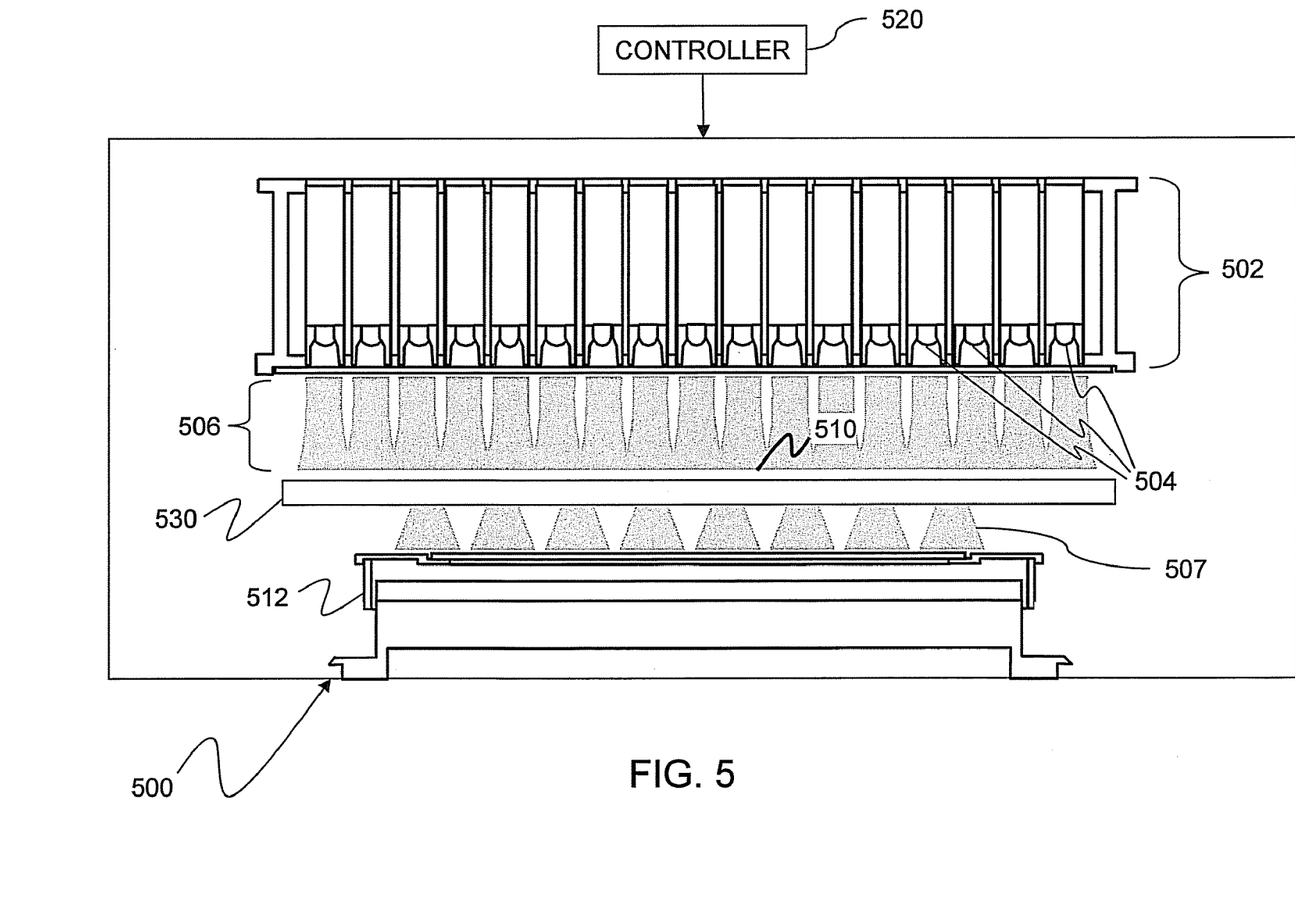
FIG. 5 is a diagram of a variation of the apparatus.

In the embodiments described above, the laser is a far infrared laser. In another system 500, shown in FIG. 5, a chamber 500 has a thermal radiation filter 530 added to a light source 502 that emits light over a broad range of frequencies. The filter 530 passes far infrared light 507 and eliminates other unnecessary light (e.g., visible and near infrared light) from the emitted light 506. The light source 502 may be any light source emitting a spectrum of light with a substantial far-infrared component (and is not limited to a far infrared laser). Because some of the light 506 is reflected or absorbed by the filter 530, the light source 502 emits light 506 with greater intensity than the light source 302 described above with reference to FIG. 3 to compensate for the reduction in intensity of the light that is passed through. The other elements of FIG. 5 (controller 520, light elements 504 and chuck 512) may be the same or similar to the corresponding elements (controller 320, lights 304 and chuck 312) shown in FIG. 3.

Figure 6:
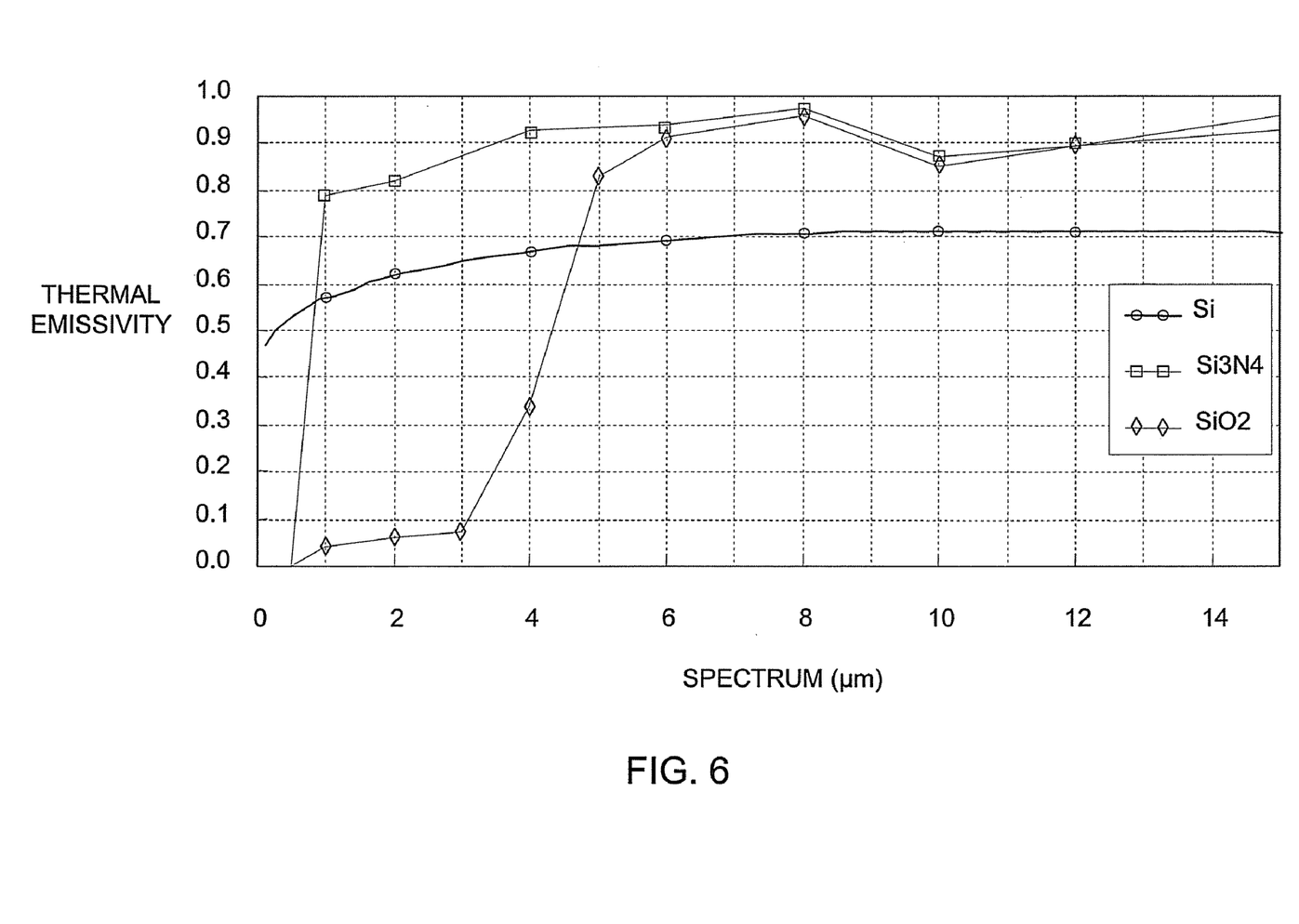
FIG. 6 is a diagram showing thermal emissivity versus RTP light wavelength for various materials.
Figure 7:
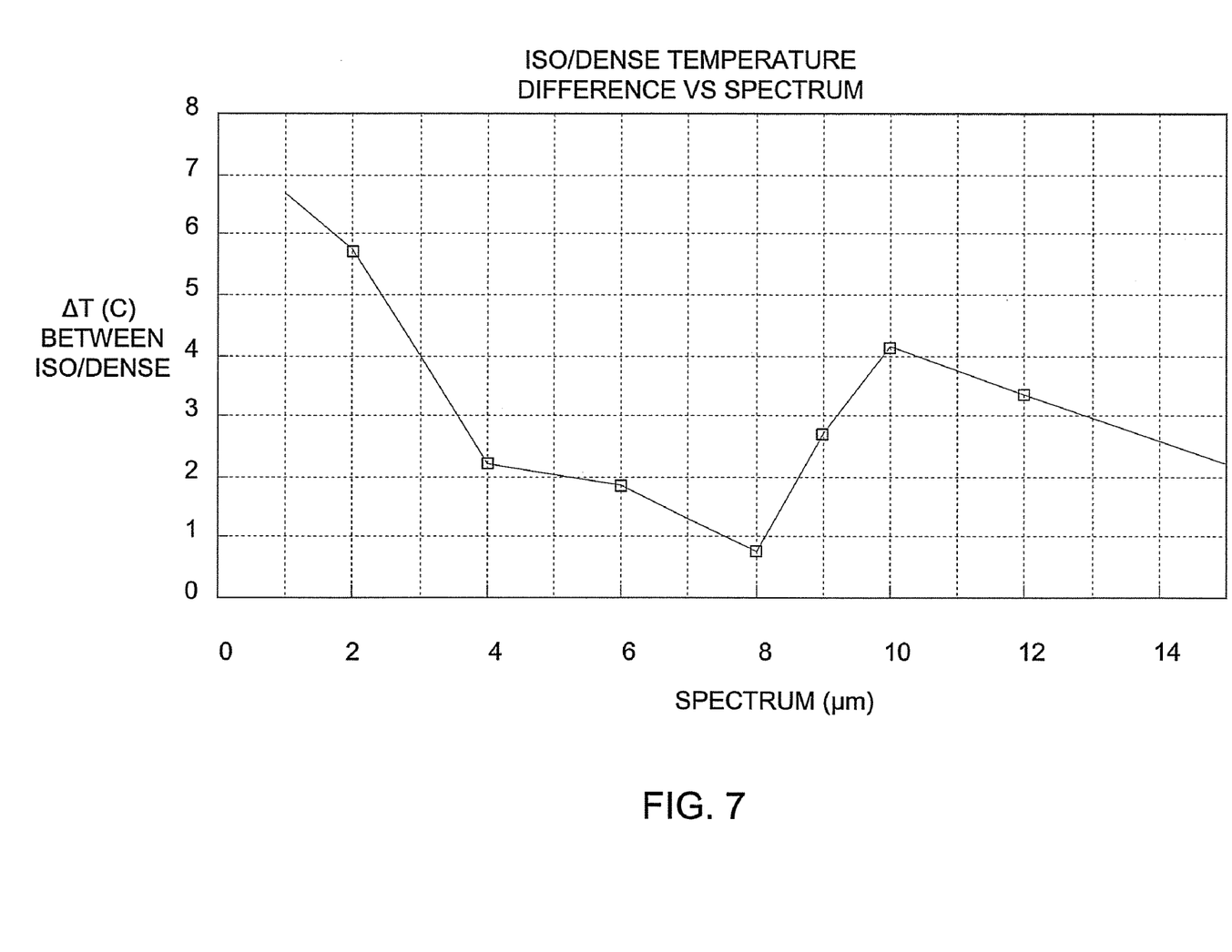
FIG. 7 is a diagram showing temperature difference between iso and dense regions at several RTP light wavelengths.

FIGS. 6 and 7 provide simulation data for light having a variety of wavelengths, applied for RTP spike annealing of a variety of materials. In FIG. 6, simulations were performed for Si, SiO$_2$, and Si$_3$N$_4$. Generally, the differences in emissivities are smaller and the emissivities vary less when the wavelength is 6 μm or more. Because a dense region has less bare silicon than an isolated (iso) region, temperature differences due to differences in material emissivity are most apparent when the temperatures of dense and iso regions are compared. FIG. 7 shows the impact of wavelength on the temperature difference between dense and iso regions. The temperature difference falls in the range from 1 μm to 8 μm. As shown by the simulation, lower temperature differences are observed from 4 μm to 9 μm, and the smallest temperature difference is observed at 8 μm.

Annealing with light having longer wavelengths provides better improvement in pattern loading effect (PLE) than shorter wavelengths. Using light with longer wavelengths results in a lower temperature difference between isolation and dense area.

Base on simulation, higher material emissivity will induce better PLE. The optimum RTA lamp wavelength is 8 um. (material emissivity is highest).

FIGS. 6 and 7 show a method of analyzing emissivity data and temperature data from a plurality of materials over a plurality of wavelengths, from iso and dense regions. One of ordinary skill can readily apply this method to wafers have other materials at the surface, or having different pattern densities.

Use of relatively longer wavelength light for RTP spike annealing can potentially minimize the pattern loading effect which is from thermal radiation absorption difference.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method comprising:
    providing a semiconductor substrate having a plurality of patterns formed thereon or therein, at least some of the patterns comprising doped regions, the substrate having a plurality of surface regions, including the patterns and un-patterned regions, with respectively different reflectances for light in a near infrared wavelength; and
    performing a rapid thermal processing (RTP) spike annealing dopant activation step on the substrate using far infrared light,
    wherein a difference between a largest one of the different reflectances and a smallest one of the different reflectances for the far infrared light is about 0.31 or less.

2. The method of claim 1, wherein a difference between a largest one of the different reflectances and a smallest one of the different reflectances at the near infrared wavelength is about 0.47.

3. The method of claim 1, wherein the plurality of surface regions include at least two of the group consisting of silicon, polycrystalline silicon, silicon oxide and silicon nitride.

4. The method of claim 1, wherein the doped regions include at least one of the group consisting of boron, phosphorus, arsenic and BF$_2$.

5. The method of claim 1, wherein the far infrared light is emitted by one of the group consisting of a p-type germanium laser, a quantum cascade laser, a free electron laser, and a Femtosecond Ti:sapphire mode-locked laser.

6. A method comprising:
    providing a semiconductor substrate having a plurality of active device patterns formed thereon or therein, at least some of the active device patterns comprising doped regions, the substrate having a plurality of surface regions, including the active device patterns and un-patterned regions, with respectively different reflectances for light in a near infrared wavelength;
    determining a first difference between a largest one of the different reflectances at the near infrared wavelength and a smallest one of the different reflectances at the near infrared wavelength;
    determining a second infrared wavelength for which a second difference between a largest one of the different reflectances for light at the second infrared wavelength and a smallest one of the different reflectances for light at the second infrared wavelength is substantially less than the first difference at the near infrared wavelength; and
    performing a rapid thermal processing (RTP) spike annealing dopant activation step on the substrate using a second light source providing light at the second wavelength,
    wherein the second light source emits a far infrared light and at least one of the following criterion are met:
    (1) the second difference is less than the first difference by about 0.44 or more,
    (2) the second difference is about 0.31 or less, or
    (3) the second difference is less than the first difference by about 0.16.

7. The method of claim 6, wherein the far infrared laser is one of the group consisting of p-type germanium laser, quantum cascade laser, free electron laser, and a Femtosecond Ti:sapphire mode-locked laser.

8. The method of claim 6, wherein the plurality of surface regions include at least two of the group consisting of silicon, polycrystalline silicon, silicon oxide and silicon nitride.

9. The method of claim 6, wherein the doped regions include at least one of the group consisting of boron, phosphorus, arsenic and BF2.

10. The method of claim 6, wherein the step of performing an RTP spike annealing step includes filtering the light provided by the light source.

11. A method comprising:
    providing a semiconductor substrate having a plurality of patterns formed thereon or therein, at least some of the patterns comprising doped regions, the substrate having a plurality of surface regions, including the patterns and un-patterned regions, with respectively different reflectances for light in a near infrared wavelength; and
    performing a rapid thermal processing (RTP) spike annealing dopant activation step on the substrate using far infrared light,
    wherein the far infrared light is emitted by one of the group consisting of a p-type germanium laser, a quantum cascade laser, a free electron laser, and a Femtosecond Ti:sapphire mode-locked laser, and
    wherein a difference between a largest one of the different reflectances and a smallest one of the different reflectances at the near infrared wavelength is about 0.47.

12. The method of claim 11, wherein a difference between a largest one of the different reflectances and a smallest one of the different reflectances for the far infrared light is about 0.31 or less.

13. The method of claim 11, wherein the plurality of surface regions include at least two of the group consisting of silicon, polycrystalline silicon, silicon oxide and silicon nitride.

14. The method of claim 11, wherein the doped regions include at least one of the group consisting of boron, phosphorus, arsenic and $BF_2$.

15. A method, comprising:
providing a semiconductor substrate having a plurality of active device patterns formed thereon or therein, at least some of the active device patterns comprising doped regions, the substrate having a plurality of surface regions, including the active device patterns and un-patterned regions, with respectively different reflectances for light in a near infrared wavelength;
determining a first difference between a largest one of the different reflectances at the near infrared wavelength and a smallest one of the different reflectances at the near infrared wavelength;
determining a second infrared wavelength for which a second difference between a largest one of the different reflectances for light at the second infrared wavelength and a smallest one of the different reflectances for light at the second infrared wavelength is substantially less than the first difference at the near infrared wavelength; and
performing a rapid thermal processing (RTP) spike annealing dopant activation step on the substrate using a second light source providing light at the second wavelength,
wherein the second light source emits a far infrared light and is selected from the group consisting of a p-type germanium laser, a quantum cascade laser, a free electron laser, and a Femtosecond Ti:sapphire mode-locked laser, and
wherein the second difference is less than the first differences by about 0.44 or more.

16. The method of claim 15, wherein the second difference is about 0.31 or less.

17. The method of claim 15, wherein the second difference is less than the first difference by about 0.16.

18. The method of claim 15, wherein the plurality of surface regions include at least two of the group consisting of silicon, polycrystalline silicon, silicon oxide and silicon nitride.

19. The method of claim 15, wherein the doped regions include at least one of the group consisting of boron, phosphorus, arsenic and $BF_2$.

20. The method of claim 15, wherein the step of performing an RTP spike annealing step includes filtering the light provided by the light source.

21. A method comprising:
providing a semiconductor substrate having a plurality of patterns formed thereon or therein, at least some of the patterns comprising doped regions, the substrate having a plurality of surface regions, including the patterns and un-patterned regions, with respectively different reflectances for light in a near infrared wavelength; and
performing a rapid thermal processing (RTP) spike annealing dopant activation step on the substrate using far infrared light,
wherein a difference between a largest one of the different reflectances and a smallest one of the different reflectances at the near infrared wavelength is about 0.47.

* * * * *